US009406881B1

(12) United States Patent
Tortorelli et al.

(10) Patent No.: US 9,406,881 B1
(45) Date of Patent: Aug. 2, 2016

(54) MEMORY CELLS HAVING A HEATER ELECTRODE FORMED BETWEEN A FIRST STORAGE MATERIAL AND A SECOND STORAGE MATERIAL AND METHODS OF FORMING THE SAME

(71) Applicant: Micron Technology, Inc., Boise, ID (US)

(72) Inventors: Innocenzo Tortorelli, Cernusco sul Naviglio (IT); Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/695,619

(22) Filed: Apr. 24, 2015

(51) Int. Cl.
*H01L 45/00* (2006.01)
*H01L 27/24* (2006.01)

(52) U.S. Cl.
CPC .......... *H01L 45/126* (2013.01); *H01L 27/2463* (2013.01); *H01L 45/06* (2013.01); *H01L 45/1233* (2013.01); *H01L 45/1608* (2013.01)

(58) Field of Classification Search
CPC .............. H01L 45/1233; H01L 45/126; F21Y 2113/005
See application file for complete search history.

(56) References Cited

U.S. PATENT DOCUMENTS

| 5,912,839 | A | 6/1999 | Ovshinsky et al. |
| 6,569,705 | B2 | 5/2003 | Chiang et al. |
| 6,642,102 | B2 | 11/2003 | Xu |
| 6,795,338 | B2 | 9/2004 | Parkinson et al. |
| 6,944,041 | B1 | 9/2005 | Li et al. |
| 6,967,344 | B2 | 11/2005 | Ovshinsky et al. |
| 7,038,261 | B2 | 5/2006 | Horii |
| 7,977,661 | B2 | 7/2011 | Philipp et al. |
| 2003/0045034 | A1 | 3/2003 | Davis et al. |
| 2003/0156452 | A1 | 8/2003 | Gilton |
| 2006/0002173 | A1 | 1/2006 | Parkinson et al. |
| 2006/0172067 | A1 | 8/2006 | Ovshinsky et al. |
| 2006/0226410 | A1* | 10/2006 | Wicker ............. G11C 13/0004 257/2 |
| 2007/0297213 | A1* | 12/2007 | Czubatyj ............. H01L 27/2427 365/148 |
| 2009/0257275 | A1 | 10/2009 | Karpov et al. |
| 2010/0163817 | A1 | 7/2010 | Savransky et al. |
| 2010/0165716 | A1 | 7/2010 | Kau et al. |

FOREIGN PATENT DOCUMENTS

| JP | 2006510220 A | 3/2006 |
| JP | 2007525816 A | 9/2007 |

OTHER PUBLICATIONS

U.S. Appl. No. 14/321,222, entitled Memory Cells Having a First Selecting Chalcogenide Material and a Second Selecting Chalcogenide Material and Methods Therof, filed Jul. 1, 2014, 18 pp.
Non-Final Office Action from U.S. Appl. No. 14/321,222, dated Nov. 10, 2015, 15 pp.
Final Office Action from U.S. Appl. No. 14/321,222, dated Jan. 14, 2016 15 pp.
International Search Report and Written Opinion from international application No. PCT/US2015/038245, dated Oct. 7, 2015, 19 pp.

* cited by examiner

*Primary Examiner* — Thomas L Dickey
(74) *Attorney, Agent, or Firm* — Brooks, Cameron & Huebsch, PLLC

(57) ABSTRACT

The present disclosure includes memory cells and methods of forming the same. The memory cells disclosed herein can include a heater electrode formed between a first storage material and a second storage material.

20 Claims, 4 Drawing Sheets

MEMORY CELLS HAVING A HEATER ELECTRODE FORMED BETWEEN A FIRST STORAGE MATERIAL AND A SECOND STORAGE MATERIAL AND METHODS OF FORMING THE SAME

TECHNICAL FIELD

The present disclosure relates generally to memory cells, and more particularly to memory cells having a heater electrode formed between a first storage material a second storage material, memory arrays, and methods of forming the same.

BACKGROUND

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others. Types of resistance variable memory include phase change random access memory (PCRAM) and resistive random access memory (RRAM), for instance.

Resistance variable memory devices can include a resistance variable material, e.g., a phase change material, for instance, which can be programmed into different resistance states to store data. The particular data stored in a resistance variable material cell can be read by sensing the cell's resistance e.g., by sensing current and/or voltage variations based on the resistance of the resistance variable material.

DETAILED DESCRIPTION

Figure 1:
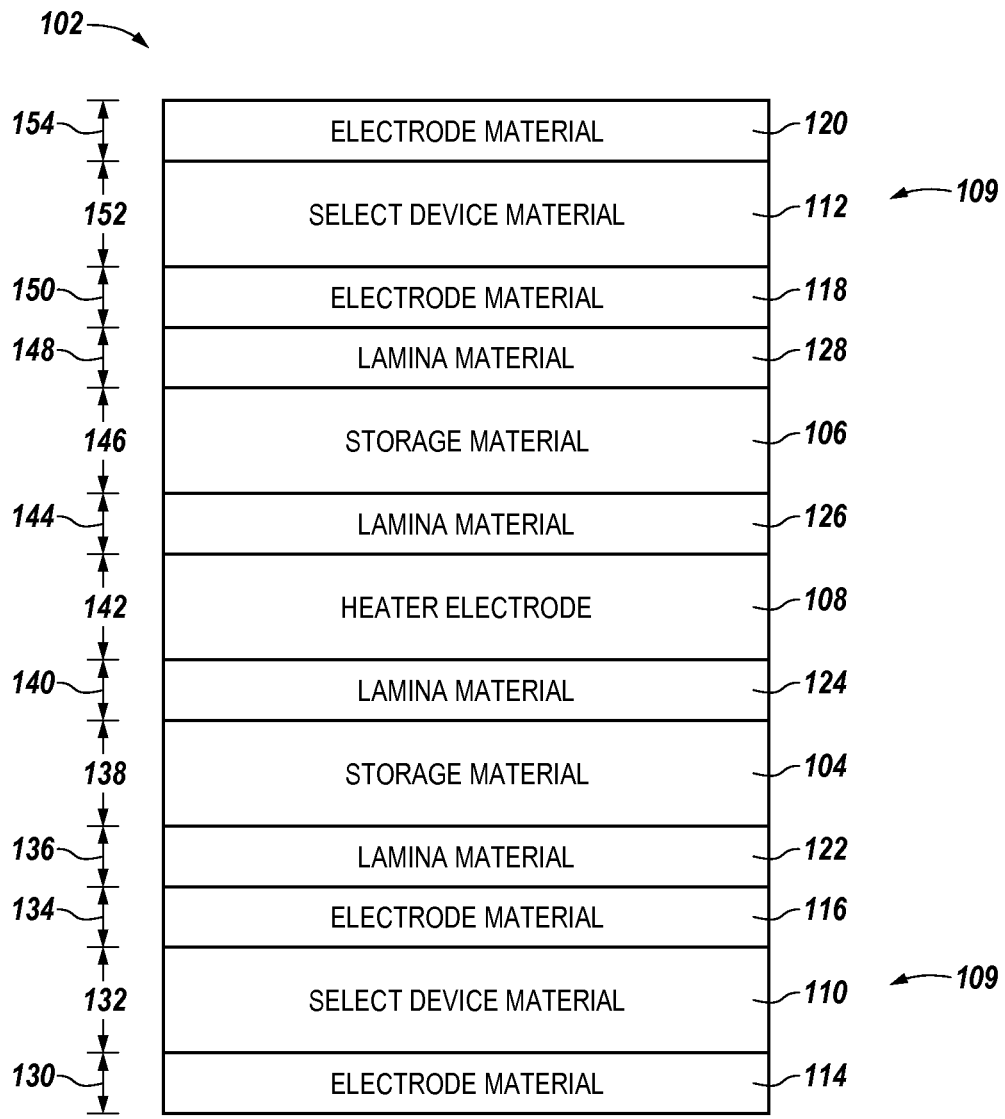
FIG. 1 illustrates a portion of a memory cell in accordance with a number of embodiments of the present disclosure.

Memory cells having a first storage material, a second storage material, and a heater electrode and methods of manufacturing the same are described herein. As an example, a memory cell can include a first storage material, a second storage material, and a heater electrode, where the heater electrode is formed between the first storage material the second storage material.

Previous memory cells have not utilized a heater electrode formed between a first storage material and a second storage material. Embodiments of the present disclosure can provide benefits such as reducing thermal disturb to adjacent memory cells and/or, providing for utilization of lower programming currents among others, as compared to previous memory cells not having a heater electrode formed between the first storage material and the second storage material.

Because the heater electrodes of memory cells according to the present disclosure are formed between the first storage material and the second storage material, memory cells according to the present disclosure can provide a more directed heating, e.g., heat can be provided more directly to areas associated with programming the storage material, as compared to previous memory cells not having a heater electrode formed between a first storage material and a second storage material. For instance, there may be greater thermal resistances, e.g., greater thermal isolation, associated with areas of the storage materials that phase change for programming the memory cell. For example, the areas associated with programming the storage materials, may be more thermally isolated from conductive lines, such as access lines and data/sense lines, than other elements of the memory cell and/or other portions of the storage materials. Providing the heater electrodes that are formed between the first storage material and the second storage material, as disclosed herein, can provide that lower energy, e.g., lower programming currents, may be utilized for programming memory cells according to the present disclosure, as compared to previous memory cells. Also, the lower programming energy can help to reduce programming disturb, e.g., thermal energy inadvertently provided to neighboring memory cells, among other benefits.

In the detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "8" in FIG. 1, and a similar element may be referenced as 208 in FIG. 2. Also, as used herein, "a number of" a particular element and/or feature can refer to one or more of such elements and/or features.

FIG. 1 illustrates a portion of a memory cell 102 in accordance with a number of embodiments of the present disclosure. As illustrated in FIG. 1, the memory cell 102 can include: a storage material 104, e.g., a first storage material; a storage material 106, e.g., a second material; a heater electrode 108; and a select device 109. As illustrated in FIG. 1, the select device 109 can include a select device material 110, e.g., a first portion of the select device 109, and a select device material 112, e.g., a second portion of the select device 109. The select device materials 110, 112 can be operated, e.g., turned on/off, to select/deselect a memory cell in order to perform operations such as data programming, e.g., writing, and/or data sensing, e.g., reading operations. For instance, responsive to an applied voltage across the memory cell 102 that is less than a threshold voltage, the select device materials 110, 112 can remain in an "off" state, e.g., an electrically nonconductive state. Alternatively, responsive to an applied voltage across the memory cell 102 that is greater than the threshold voltage, the select device materials 110, 112 can be in an "on" state. Some embodiments of the present disclosure provide that the select device 109 can be a switch, e.g., a MOS transistor, a BJT, a diode, an ovonic threshold switch (OTS), among other types of switches. Some embodiments of the present disclosure provide that the select 109 can be a three terminal switch. The storage materials 104, 106 can store a data state of the memory cell 102. The memory cell 102 can include electrode materials 114, 116, 118, 120, and lamina materials 122, 124, 126, 128. As illustrated in FIG. 1, components of the memory cell 102, e.g., the first storage material 104, the second storage material 106, the heater electrode 108, the first portion 110 of the select device 109, and the second portion 112 of the select device 109 can be formed in series.

As illustrated in FIG. 1, the select device material 110 can be formed on, e.g., subsequent to, an electrode material 114. In the example illustrated in FIG. 1, the select device material 110 is formed on, e.g., in contact with, the electrode material 114. However, examples of the present disclosure are not so limited. For instance, a number of intervening materials, not shown in FIG. 1, may separate a material formed on another material, such as the select device material 110 and the electrode material 114, among others. The electrode material 114 may be formed on a conductive line, as discussed further herein.

The electrode material 114 can include materials such as Ti, Ta, W, Al, Cr, Zr, Nb, Mo, Hf, B, C, N, conductive nitrides of the aforementioned materials, e.g., TiN, TaN, WN, CN, etc., and/or combinations thereof. The electrode material 114 can have a thickness 130 in a range from about 8 nanometers (nm) to about 15 nm, for instance.

Embodiments of the present disclosure provide that the select device materials 110, 112 do not store a data state of the memory cell 102, e.g., in contrast to the storage materials 104, 106 the select device materials 110, 112 do not have different resistance values that are stable over time. For instance, the select device materials 110, 112 can be in a perpetual amorphous state. The select device materials 110, 112 can include As, Te, Ge, Si, S, and/or Se. Some specific examples of the select device materials 110, 112 include AsTeGeSi, $As_2Te_3Ge$, and $As_2Se_3Ge$.

The select device material 110 can have a thickness 132 in a range from about 6 nm to about 20 nm, for instance. Some embodiments of the present disclosure provide that the select device material 104 can have a thickness 132 in a range from about 7.5 nm to about 15 nm.

As illustrated in FIG. 1, the electrode material 116 can be formed on the select device material 110. The electrode material 116 can be similar to the electrode material 114, e.g., the electrode material 116 can include a number of materials as discussed with the electrode material 114. Additionally, the electrode material 116 can have a thickness 134 in a range from about 8 nm to about 20 nm.

As illustrated in FIG. 1, the lamina material 122 can be formed on the electrode material 116. The lamina material 122 may be utilized to improve an electrical contact, e.g., of the storage materials 104, 106. The lamina material 122 can include materials such as W, TiN, CN, WsiN, and/or TiSiN, among others. The lamina material 122 can have a thickness 136 in a range from about 4 nm to about 15 nm.

Embodiments of the present disclosure provide that the memory cell 102 includes the storage materials 104, 106. Embodiments of the present disclosure provide that the storage materials 104, 106 are programmable, e.g. the storage materials 104, 106 may have a variable resistance. Embodiments of the present disclosure provide that the storage materials 104, 106 can include a resistance variable material that can be programmed into different resistance states to store data. For example, a combined resistance of the storage materials 104, 106 can determine a data state of the memory cell 102.

The storage materials 104, 106 can include, for example, one or more resistance variable materials such as a metal oxide material, such as alkaline metal oxides, e.g., $Li_2O$, $Na_2O$, $K_2O$, $Rb_2O$, $Cs_2O$, BeO, MgO, CaO, SrO, and BaO, refractive metal oxides, e.g., NbO, $NbO_2$, $Nb_2O_5$, $MoO_2$, $MoO_3$, $Ta_2O_5$, $W_2O_3$, $WO_2$, $WO_3$, $ReO_2$, $ReO_3$, and $Re_2O_7$, and binary metal oxides, e.g., $Cu_xO_y$, $WO_x$, $Nb_2O_5$, $Al_2O_3$, $Ta_2O_5$, $TiO_x$, $ZrO_x$, $Ni_xO$ and $Fe_xO$, among others. Other examples of resistance variable materials associated with the storage materials 104, 106 of the memory cell 102 can include chalcogenides, binary metal oxides, colossal magnetoresistive materials such as $Pr_{(1-x)}Ca_xMnO_3$ (PCMO), $La_{(1-x)}Ca_xMnO_3$ (LCMO), and $Ba_{(1-x)}Sr_xTiO_3$, among others, and/or perovskite oxides such as doped or undoped $SrTiO_3$, $SrZrO_3$, and $BaTiO_3$, and polymer materials such as Bengala Rose, $AlQ_3Ag$, Cu-TCNQ, DDQ, TAPA, and Fluorescine-based polymers, among others. As such, the memory cell 102 can be a RRAM cell, a PCRAM cell, and/or a conductive bridging memory cell, among various other types of resistive memory cells. The storage materials 104, 106 can include materials such as In, Ge, Sb, Te, Si, 0, N, and/or combinations thereof. Some specific examples, e.g., chalcogenides, of the storage material 108 include $Ge_2Sb_2Te_5$, $Ge_1Sb_2Te_4$, $Ge_1Sb_4Te_7$, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt. Embodiments of the present disclosure are not limited to a particular type of resistance variable material.

As illustrated in FIG. 1, the storage material 104 can be formed on the lamina material 122. The storage material 104 can have a thickness 138 in a range from 10 nm to 50 nm. Some embodiments of the present disclosure provide that the storage material 104 can have a thickness 138 in a range from 15 nm to 35 nm.

As illustrated in FIG. 1, a lamina material 124 can be formed on the storage material 104. The lamina material 124 can be similar to the lamina material 122, e.g., the lamina material 124 can include a number of materials as discussed with the lamina material 122. Additionally, the lamina material 124 can have a thickness 140 in a range from 8 nm to 20 nm.

As illustrated in FIG. 1, a heater electrode 108 can be formed on the lamina material 124. The heater electrode 108 may be utilized as a heater that can heat-up, e.g., by a Joule effect, to provide energy and/or increased temperature to the adjacent storage materials 104, 106. The heater electrode 108 can include materials such as W, Si, N, B, Ta, Sn, Ti, 0, and C. Some specific examples of the heater electrode material 108 include WSiN, WSiC, TiSiN, and SiC. Embodiments of the present disclosure provide that the heater electrode 108 can have a resistivity from 1 milliohm-centimeter to 500 milliohm-centimeter. The heater electrode 108 can have a thickness 142 in a range from 6 nm to 35 nm.

As illustrated in FIG. 1, the lamina material 126 can be formed on the heater electrode 108. The lamina material 126 can be similar to the lamina material 122, e.g., the lamina material 126 can include a number of materials as discussed with the lamina material 122. Additionally, the lamina material 126 can have a thickness 144 in a range from 8 nm to 20 nm.

As illustrated in FIG. 1, the storage material 106 can be formed on the lamina material 126. The storage material 106 can have a thickness 146 in a range from 10 nm to 50 nm. Some embodiments of the present disclosure provide that the storage material 106 can have a thickness 146 in a range from 15 nm to 35 nm. Embodiments of the present disclosure provide that the heater electrode material 108 is formed between the storage material 104 and the storage material 106. Forming the heater electrode 108 between the storage material 104 and the storage material 106 can help to increase a local temperature in particular volumes of the storage material 104 and the storage material 106, e.g., volumes near to the heater electrode 108.

As illustrated in FIG. 1, the lamina material 128 can be formed on the storage material 106. The lamina material 128 can be similar to the lamina material 122, e.g., the lamina material 128 can include a number of materials as discussed with the lamina material 122. Additionally, the lamina material 128 can have a thickness 148 in a range from 8 nm to 20 nm.

As illustrated in FIG. 1, the electrode material 118 can be formed on the lamina material 128. The electrode material 118 can be similar to the electrode material 114, e.g., the electrode material 118 can include a number of materials as discussed with the electrode material 114. Additionally, the electrode material 118 can have a thickness 150 in a range from 8 nm to 20 nm.

As illustrated in FIG. 1, the select device material 112 can be formed on the electrode material 118. The select device material 112 can have a thickness 152 in a range from 7.5 nm to 15 nm.

As illustrated in FIG. 1, the electrode material 120 can be formed on the electrode material 118. The electrode material 120 can be similar to the electrode material 114, e.g., the electrode material 120 can include a number of materials as discussed with the electrode material 114. Additionally, the electrode material 120 can have a thickness 154 in a range from 8 nm to 20 nm.

Some embodiments of the present disclosure provide that the memory cell 102 is symmetric about the heater electrode 108. For instance, the memory cell 102 can include the electrode material 114, the select device material 110, the electrode material 116, the lamina material 122, the storage material 104, and the lamina material 124 and, transverse the heater electrode 108, the memory cell 102 can include the lamina material 126, the storage material 106, the lamina material 128, the electrode material 118, the select device material 112 and the electrode material 120. In some embodiments, at least on pair of symmetrically corresponding components of the memory cell 102 located on opposite sides of the heater electrode 108 have equal thicknesses. For instance, the thickness 132 of the select device material 110 is equal to the thickness 152 of the select device material 112, and the thickness 138 of the storage material 104 is equal to the thickness 146 of the storage material 106, and so forth.

Additionally, the same material or materials can be used to form symmetrically corresponding components of the memory cell 102 located on opposite sides of the heater electrode 108. For instance, the same material or materials can be used to form both the select device material 110 and the select device material 112, and the same material or materials can be used to form both the storage material 104 and the storage material 106, and so forth. For example, some embodiments of the present disclosure provide that the select device material 110 comprises a first material and the select device material 112 comprises a second material that is a same material as the first material.

Some embodiments of the present disclosure provide that the memory cell 102 is symmetric about the heater electrode 108 and can have a symmetric thermal profile. For instance, the symmetry can provide that temperature hot spots for a phase change of the storage materials 104, 106 are substantially equally thermally isolated from an access line and a data/sense line, which are discussed further herein.

Some embodiments of the present disclosure provide that the memory cell 102 is asymmetric about the heater electrode 108. Being asymmetric about the heater electrode 108, a number of corresponding components of the memory cell 102 located on opposite sides of the heater electrode 108 may have different thicknesses. For instance, the thickness 132 of the select device material 110 may be different than, e.g., greater than or less than, the thickness 152 of the select device material 112, and/or the thickness 138 of the storage material 104 may be different than the thickness 146 of the storage material 106, and so forth.

Additionally, being asymmetric about the heater electrode 108, a different material or materials can be used to form used to form a number of corresponding components of the memory cell 102 located on opposite sides of the heater electrode 108. For example, some embodiments of the present disclosure provide that the select device material 110 comprises a first material and the select device material 112 comprises a second material that is a different material as the first material, and so forth.

Figure 2:
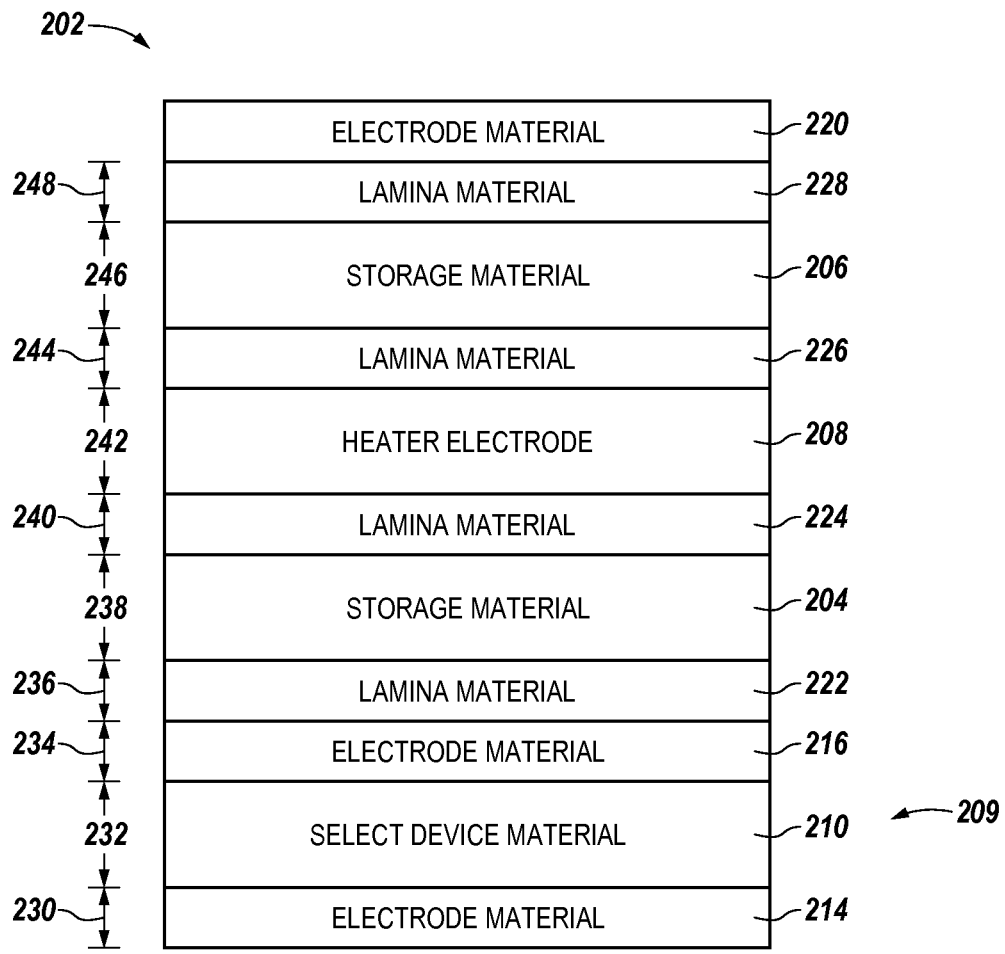
FIG. 2 illustrates a portion of a memory cell in accordance with a number of embodiments of the present disclosure.

FIG. 2 illustrates a portion of a memory cell 202 in accordance with a number of embodiments of the present disclosure. As mentioned, some embodiments of the present disclosure provide that the memory cell 202 is asymmetric about the heater electrode 208. As illustrated in FIG. 2, the memory cell 202 is asymmetric about the heater electrode material 208; the select device 209 includes the select device material 210 and does not include a corresponding select device material located on opposite sides of the heater electrode 208. For some applications, forming a memory cell 202 that is asymmetric about the heater electrode 208 may reduce a number of processing steps and/or processing complexity, as compared to a memory cell that is symmetric about the heater electrode material, for instance. As illustrated in FIG. 2, components of the memory cell 202, e.g., the first storage material 204, the second storage material 206, the heater electrode 208, and the select device 209 can be formed in series.

As mentioned, the select device 209 includes the select device material 210 and does not include a corresponding select device material located on opposite sides of the heater electrode 208. Some embodiments of the present disclosure provide that the select device 209 can be a switch, e.g., a MOS transistor, a BJT, a diode, an ovonic threshold switch (OTS), among other types of switches. Some embodiments of the present disclosure provide that the select device 209 can be a three terminal switch.

The memory cells according to the present disclosure can be formed using various processing techniques such as atomic material deposition (AMD), e.g., atomic layer deposition (ALD), physical vapor deposition (PVD), chemical vapor deposition (CVD), molecular beam epitaxy (MBE), supercritical fluid deposition (SFD), patterning, etching, filling, chemical mechanical planarization (CMP), combinations thereof, and/or other suitable processes. In accordance with a number of embodiments of the present disclosure, materials may be grown in situ.

Figure 3:
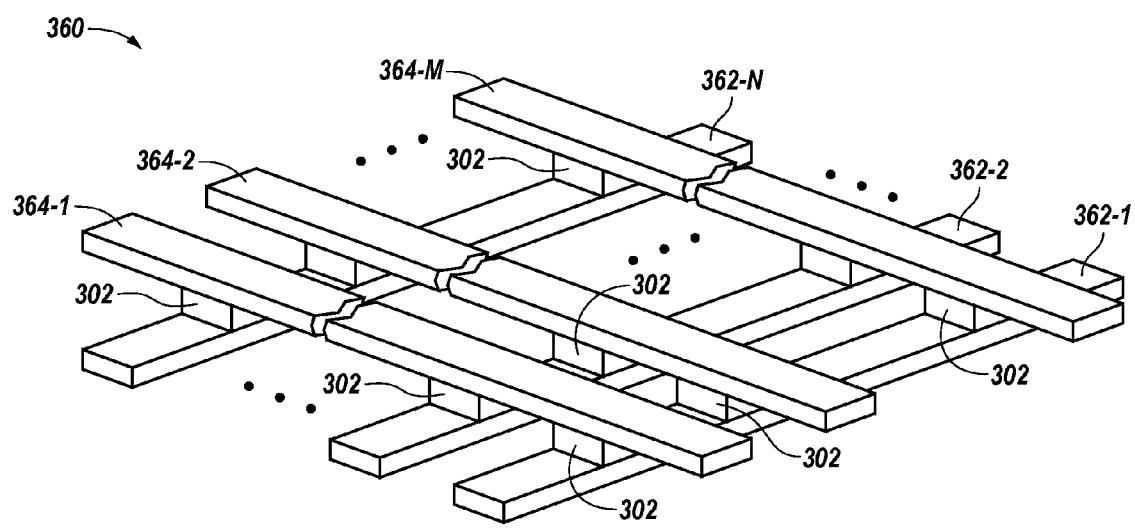
FIG. 3 illustrates a portion of a resistive memory array in accordance with a number of embodiments of the present disclosure.

FIG. 3 illustrates a portion of a memory array 360 in accordance with a number of embodiments of the present disclosure. The array 360 can be a cross-point array, which may also be referred to as a crossbar array.

The array 360 can include a number memory cells 302, where each memory cell 302 is located at a respective intersection of a first plurality of conductive lines, e.g., access lines, 362-1, 362-2, . . . , 362-N, which may be referred to herein as word lines, and a second plurality of conductive lines, e.g., data/sense lines, 364-1, 364-2, . . . , 364-M, which may be referred to herein as bit lines. The designators N and M can have various values. Embodiments are not limited to a particular number of word lines and/or bit lines. As illustrated, the access lines 362-1, 362-2, . . . , 362-N are substantially parallel to each other and are substantially orthogonal to the data/sense lines 364-1, 364-2, . . . , 364-M, which are substantially parallel to each other; however, embodiments are not so limited. As illustrated in FIG. 3, the array 360 can be a two dimensional array. For example, the memory cells 302 of the array 360 can be arranged between the access lines, 362-1, 362-2, . . . , 362-N and the data/sense lines, 364-1, 364-2, . . . , 364-M in a single tier.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation. The conductive lines can include conductive material, e.g., a metal material. Examples of the conductive material include, but are not limited to, tungsten, copper, titanium, aluminum, and/or combinations thereof, among other conductive materials.

In operation, a selected memory cell 302 can be programmed by applying a voltage, e.g., a write voltage, across the selected memory cell 302 via a selected access line 362-1, 362-2, . . . , 362-N and a selected data/sense line 364-1, 364-2, . . . , 364-M. The width and/or magnitude of voltage pulses across the selected memory cell 302 can be adjusted, e.g., varied, in order to program the selected memory cell 302 to particular data states, e.g., by adjusting a resistance level of the storage materials discussed herein, e.g., by a phase change to the storage materials 104/106, 204/206. A sensing, e.g., read, operation can be used to determine the data state of a memory cell 302 by a sensing current, for example, on a data/sense line 364-1, 364-2, . . . , 364-M corresponding to the memory cell 302 responsive to a particular voltage applied to a selected access line to which the memory cell 302 is coupled. Sensing operations can also include biasing unselected access lines 362-1, 362-2, . . . , 362-N and/or unselected data/sense lines 364-1, 364-2, . . . , 364-M at particular voltages in order to sense the data state of the selected memory cell 302.

Figure 4:
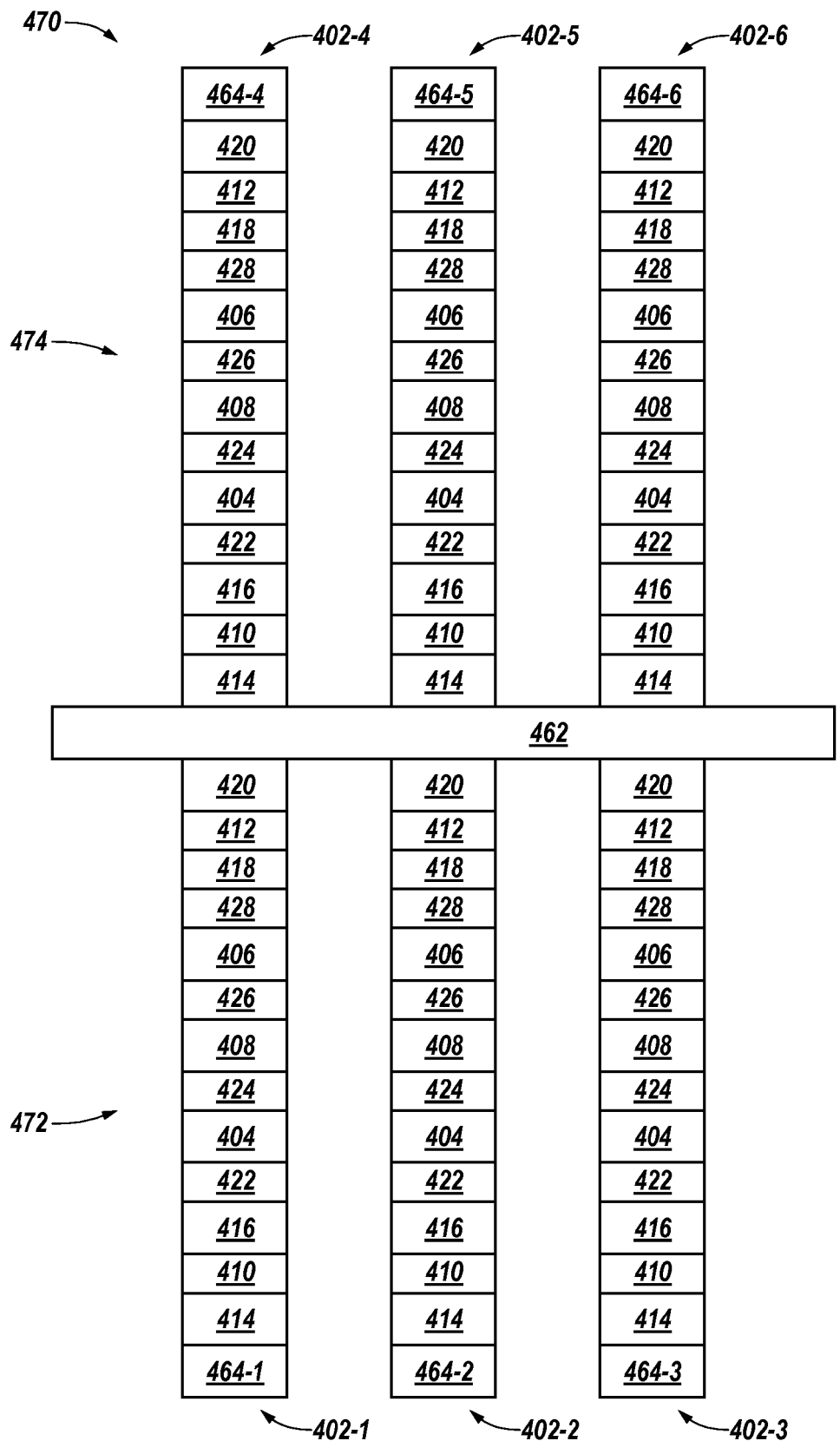
FIG. 4 illustrates a portion of a three dimensional resistive memory array in accordance with a number of embodiments of the present disclosure.

FIG. 4 illustrates a portion of a three dimensional memory array 470 in accordance with a number of embodiments of the present disclosure. As illustrated in FIG. 4, the array 470 includes a plurality memory cells 402-1, 402-2, 402-3, 402-4, 402-5, 402-6 arranged into multiple tiers, e.g., tier 472 and tier 474, which may also be referred to as levels. While FIG. 4 illustrates two tiers, embodiments of the present disclosure are not so limited; the array 470 can include varying numbers of tiers for different applications. In one or more embodiments, the processes of forming a memory cell and/or memory cell array can be repeated a number of times to create a number of tiers.

Each tier, e.g., tiers 472, 474, of the array 470 the memory cells 402 can be arranged in a cross point architecture where the memory cells 402 of adjacent tiers share a plurality of conductive lines, e.g., word lines or bit lines. For example, as illustrated in FIG. 4, the memory cells 402-1, 402-2, 402-3 of tier 472 share the word line 462 with the memory cells of 402-4, 402-5, 402-6 of tier 474. Similarly, other cells of tier 472 would share other word lines with other cells of tier 474. Embodiments of the present disclosure are not limited to memory cells 402 of adjacent tiers sharing a plurality of word lines. For instance, some embodiments of the present disclosure provide that memory cells 402 of adjacent tiers share a plurality of bit lines. As mentioned, some embodiments of the present disclosure provide that the cells, e.g., cells 402-1, 402-2, 402-3 of tier 472 and cells of 402-4, 402-5, 402-6 of tier 474 can be symmetric. This cell symmetry can provide that cells of adjacent tiers, e.g., tiers 472 and 474, have similar properties, e.g., the cells are indistinguishable from one another. Advantageously, this cell symmetry can provide improved multiple tier arrays, as compared to previous arrays.

While the memory cells 402-1, 402-2, 402-3 of tier 472 share the word line 462 with the memory cells of 402-4, 402-5, 402-6 of tier 474, each of the memory cells 402-1, 402-2, 402-3, 402-4, 402-5, 402-6 is associated with a respective bit line 464. As shown in FIG. 4, memory cells 402-1, 402-2, 402-3, 402-4, 402-5, 402-6 are respectively associated with bit lines 464-1, 464-2, 464-3, 464-4, 464-5, 464-6.

As discussed, some examples of the present disclosure provide that the cells, e.g. cells 402-1, 402-2, 402-3, 402-4, 402-5, 402-6, are symmetric about respective heater electrodes 408. Also, as discussed, some examples of the present disclosure provide that the cells, e.g., cells 402-1, 402-2, 402-3, 402-4, 402-5, 402-6, are asymmetric about respective heater electrodes 408.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory cell, comprising:
a select device;
a first storage material;
a second storage material; and
a heater electrode formed between the first storage material the second storage material, wherein the first storage material and the second storage material are each formed between respective lamina materials.

2. The memory cell of claim 1, wherein the first storage material and the second storage material comprise a resistance variable material.

3. The memory cell of claim 1, wherein the first storage material and the second storage material comprise a chalcogenide material.

4. The memory cell of claim 1, wherein the first storage material and the second storage material are formed subsequently to the select device.

5. The memory cell of claim 1, wherein the first storage material and the second storage material are formed between a first portion of the select device and a second portion of the select device.

6. The memory cell of claim 5, wherein the first portion of the select device and the second portion of the select device are symmetric about the heater electrode.

7. The memory cell of claim 5, wherein the first portion of the select device and the second portion of the select device are each respectively formed between a first electrode material and a second electrode material.

8. The memory cell of claim 1, wherein the first storage material and the second storage material are symmetric about the heater electrode.

9. The memory cell of claim 1, wherein the heater electrode has a resistivity from 1 milliohm-centimeter to 500 milliohm-centimeter.

10. The memory cell of claim 1, wherein the heater electrode is formed between a first lamina material and a second lamina material.

11. The memory cell of claim 10, wherein the first storage material and the second storage material are each respectively formed between a third lamina material and a fourth lamina material.

12. The memory cell of claim 1, wherein the first storage material has a first thickness and the second storage material has a second thickness that is different than the first thickness.

13. The memory cell of claim 1, wherein the first storage material has a first thickness and the second storage material has a second thickness that is equal to the first thickness.

14. An array of memory cells, comprising:
a plurality of memory cells each including a respective select device and a respective heater electrode, wherein each of the respective heater electrodes is formed between a respective first storage material and a respective second storage material, wherein the respective first storage materials and the respective second storage materials are each formed between respective lamina materials.

15. The array of claim 14, wherein each of the respective first storage materials has a thickness that is equal to a thickness of each of the respective second storage materials.

16. The array of claim 14, wherein each of the respective first storage materials has a thickness that is different than a thickness of each of the respective second storage materials.

17. A method of forming a memory cell, the method comprising:
forming a select device material;
forming a first lamina material;
forming a first storage material on the first lamina material;
forming a second lamina material on the first storage material;
forming a heater electrode on the second lamina material;
forming a third lamina material on the heater electrode;
forming a second storage material on the third lamina material, wherein the heater electrode is formed between the first storage material the storage material; and
forming a fourth lamina material on the second storage material.

18. The method of claim 17, wherein the storage material has a thickness that is equal to a thickness of the second storage material.

19. The method of claim 17, wherein the first storage material has a thickness that is different than a thickness of the second storage material.

20. The method of claim 17, wherein the first storage material, the heater electrode, and the second storage material are formed between a first portion of the select device and a second portion of the select device.

* * * * *